United States Patent
Jadhav

(10) Patent No.: US 10,651,095 B2
(45) Date of Patent: May 12, 2020

(54) THERMAL PROFILE MONITORING WAFER AND METHODS OF MONITORING TEMPERATURE

(71) Applicant: Applied Materials, Inc., Santa Clara, CA (US)

(72) Inventor: Deepak Jadhav, Karnataka (IN)

(73) Assignee: Applied Materials, Inc., Santa Clara, CA (US)

( * ) Notice: Subject to any disclaimer, the term of this patent is extended or adjusted under 35 U.S.C. 154(b) by 187 days.

(21) Appl. No.: 15/672,886

(22) Filed: Aug. 9, 2017

(65) Prior Publication Data

US 2018/0047643 A1    Feb. 15, 2018

Related U.S. Application Data

(60) Provisional application No. 62/373,455, filed on Aug. 11, 2016.

(51) Int. Cl.
| | | |
|---|---|---|
| H01L 21/66 | (2006.01) | |
| H04N 5/33 | (2006.01) | |
| H04N 5/232 | (2006.01) | |
| G01J 5/02 | (2006.01) | |
| H04N 5/225 | (2006.01) | |

(Continued)

(52) U.S. Cl.
CPC ............ H01L 22/12 (2013.01); G01J 5/025 (2013.01); G01J 5/028 (2013.01); G01J 5/0215 (2013.01); G01J 5/042 (2013.01); H01L 21/67248 (2013.01); H01L 22/26 (2013.01); H04N 5/2258 (2013.01); H04N 5/23296 (2013.01); H04N 5/247 (2013.01); H04N 5/33 (2013.01); *G01J 2005/0077* (2013.01); *H01L 22/34* (2013.01)

(58) Field of Classification Search
CPC ... H01L 22/12; H01L 21/67248; H01L 22/26; H01L 22/34; H04N 5/247; H04N 5/2258; H04N 5/33; H04N 5/23296; G01J 5/025; G01J 5/042; G01J 5/028; G01J 5/0215; G01J 2005/0077
See application file for complete search history.

(56) References Cited

U.S. PATENT DOCUMENTS

| 6,892,156 B2 | 5/2005 | Ye et al. | |
|---|---|---|---|
| 7,233,841 B2 * | 6/2007 | Sadighi | B25J 9/1692 |
| | | | 250/559.45 |

(Continued)

FOREIGN PATENT DOCUMENTS

| WO | 2016/069808 A1 | 5/2016 | |
|---|---|---|---|
| WO | WO-2016069808 A1 * | 5/2016 | ........... H05B 1/0233 |

OTHER PUBLICATIONS

Wafercam System Instruction Manual, Greene, Tweed & Co ..., 2003, pp. 1-2 (Year: 2003).*

(Continued)

*Primary Examiner* — Natalie Huls
*Assistant Examiner* — Janice M Soto
(74) *Attorney, Agent, or Firm* — Servilla Whitney LLC

(57) ABSTRACT

Thermal monitors comprising a substrate with at least one camera position on a bottom surface thereof, a wireless communication controller and a battery. The camera has a field of view sufficient to produce an image of at least a portion of a wafer support, the image representative of the temperature within the field of view. Methods of using the thermal monitors are also described.

8 Claims, 2 Drawing Sheets

(51) Int. Cl.
   *G01J 5/04*     (2006.01)
   *H01L 21/67*    (2006.01)
   *H04N 5/247*    (2006.01)
   *G01J 5/00*     (2006.01)

(56) References Cited

U.S. PATENT DOCUMENTS

| | | | |
|---|---|---|---|
| 8,104,342 B2 | 1/2012 | Sun et al. | |
| 2003/0218741 A1* | 11/2003 | Guetta | G01N 21/94 356/237.1 |
| 2011/0226759 A1* | 9/2011 | Wander | H01L 21/67109 219/702 |
| 2014/0192840 A1* | 7/2014 | Sun | G01K 1/14 374/208 |
| 2014/0374602 A1* | 12/2014 | Falcone | H01L 27/146 250/341.1 |
| 2015/0060013 A1* | 3/2015 | Buchberger, Jr. | H01J 7/32724 165/64 |
| 2015/0187828 A1* | 7/2015 | Salsman | B81B 3/0029 348/164 |
| 2015/0341991 A1 | 11/2015 | Wander et al. | |

OTHER PUBLICATIONS

FLIR Lepton Long Wave Infrared (LWIR) Datasheet, Version 1.2.3, Oct. 15, 2014, 50 pages.
KLA Tencor Corporation, SensArray Product Line Brochure, 2014, 8 pages.
Wafercam System Instruction Manual, Greene, Tweed & Co., Nov. 2003, 27 pages.
Wafercam System Technical Information Bulletin, Greene, Tweed & Co., 2003, 2 pages.
PCT International Search Report and Written Opinion in PCT/US2017/046208 dated Nov. 22, 2017, 15 pages.
PCT International Preliminary Report on Patentability in PCT/US2017/046208 dated Feb. 21, 2019, 10 pages.

* cited by examiner

THERMAL PROFILE MONITORING WAFER AND METHODS OF MONITORING TEMPERATURE

CROSS-REFERENCE TO RELATED APPLICATIONS

This application claims priority to U.S. Provisional Application No. 62/373,455, filed Aug. 11, 2016, the entire disclosure of which is hereby incorporated by reference herein.

TECHNICAL FIELD

The present disclosure relates generally to apparatus and methods for measuring and monitoring pedestal temperature. In particular, embodiments of the disclosure are directed to wafers for thermal profile monitoring and methods of monitoring the thermal profile of a processing chamber.

BACKGROUND

Currently, TC wafers are used to measure the temperature of a pedestal in a processing chamber. The process of measuring temperature can be time consuming, resulting in long lead times to open the chamber, pump-down the chamber to processing conditions and perform the temperature measurements. As throughput demands increase, the delay caused by the temperature monitoring process becomes a larger issue.

There is a need for apparatus and methods for the determination of pedestal temperatures that have a reduced delay in processing.

SUMMARY

One or more embodiments of the disclosure are directed to thermal monitors comprising a substrate, a wireless communication controller and a battery. The substrate has a top surface and a bottom surface. At least one camera is positioned on the bottom surface of the substrate. The at least one camera has a field of view. The battery is connected to the at least one camera and the wireless communication controller. The thermal monitor has a total thickness sufficient to pass through a slit valve of a processing chamber.

Additional embodiments of the disclosure are directed to thermal monitors comprising a substrate, a plurality of high resolution thermal imaging cameras, a wireless communication controller, a battery and a microcontroller. The substrate has a top surface and a bottom surface. The plurality of high resolution thermal imaging cameras is positioned at least on the bottom surface of the substrate. Each of the high resolution thermal imaging cameras produces a color gradient image representative of temperature variations. Each of the high resolution thermal imaging cameras has a field of view and the fields of view of the high resolution thermal imaging cameras overlap to provide a complete image. The wireless communication controller is configured to communicate through one or more of a wi-fi or Bluetooth standard. The battery is connected to the plurality of high resolution thermal imaging cameras and the wireless communication controller. The microcontroller is connected to the wireless communication controller, the camera and the battery. The microcontroller is configured to process data received from the plurality of high resolution thermal imaging cameras and transmits the processed data through the wireless communication controller. The thermal monitor has a total thickness sufficient to pass through a slit valve of a processing chamber. The plurality of cameras, battery and wireless communication controller are operable at temperatures in the range of about 100° C. to about 500° C.

Further embodiments of the disclosure are directed to methods of monitoring temperature of a wafer support in a processing chamber. The method comprises positioning a thermal monitor on a plurality of lift pins. The thermal monitor has a substrate with at least one camera, a wireless communication controller and a battery. The at least one camera is positioned on a bottom surface of the substrate and has a field of view. The battery is connected to the at least one camera and the wireless communication controller. The plurality of lift pins support the thermal monitor so that there is a gap between the wafer support and the bottom surface of the thermal monitor. The temperature of the wafer support is measured using the at least one camera on the thermal monitor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

Embodiments of the disclosure provide a mock wafer of, for example, aluminum/glass fitted with one or more thermal imaging camera. The control electronics associated with the thermal imaging camera may also be included on the mock wafer. Some embodiments of the disclosure advantageously provide temperature measurement devices that can be used with a standard process chamber.

The thermal imaging wafer can be loaded into the process chamber through the transfer chamber (load lock). Some embodiments of the disclosure advantageously provide thermal imaging components to measure temperature of the support pedestal which can fit within a standard load lock. The thermal imaging wafer can collect thermal image data from the pedestal, process kit, target and showerhead of various semiconductor processing apparatus. Data can be transferred wirelessly to a control system. The wireless transfer can occur by any suitable technique including, but not limited to, Bluetooth® and wi-fi. In some embodiments, the thermal imaging wafer advantageously is sized to be included in a cassette with wafers for processing so that the thermal imaging wafer and the substrates to be processed are positioned in the system together, decreasing the impact on throughput.

Figure 1:
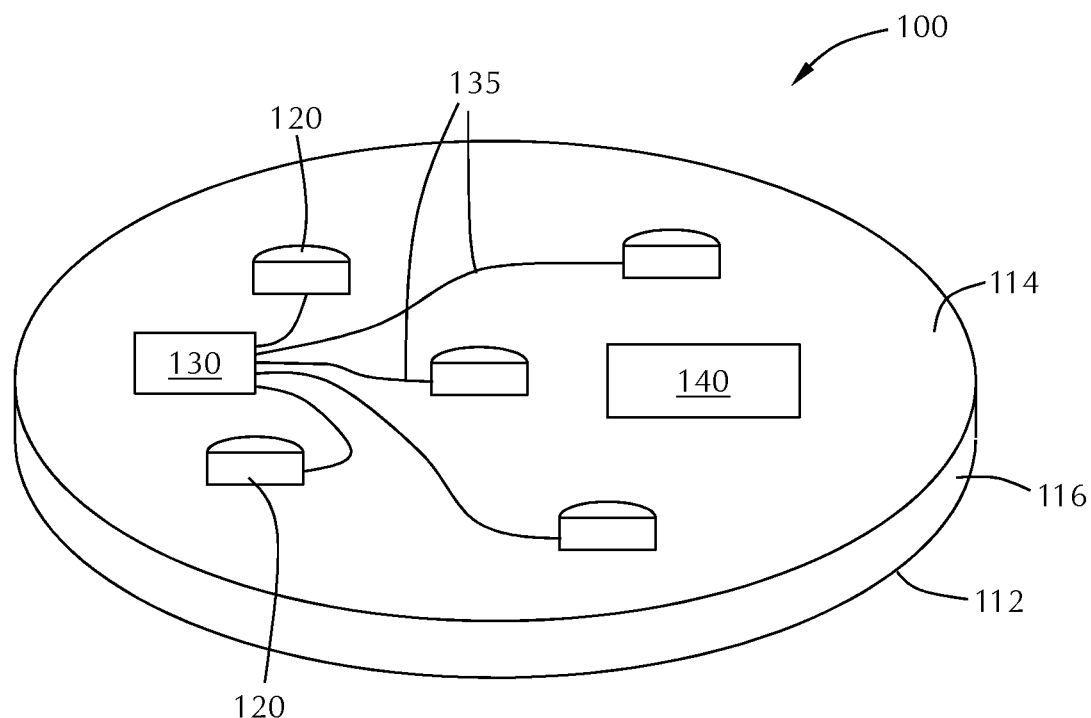
FIG. 1 shows a perspective view of a thermal monitor in accordance with one or more embodiment of the disclosure.
Figure 2:
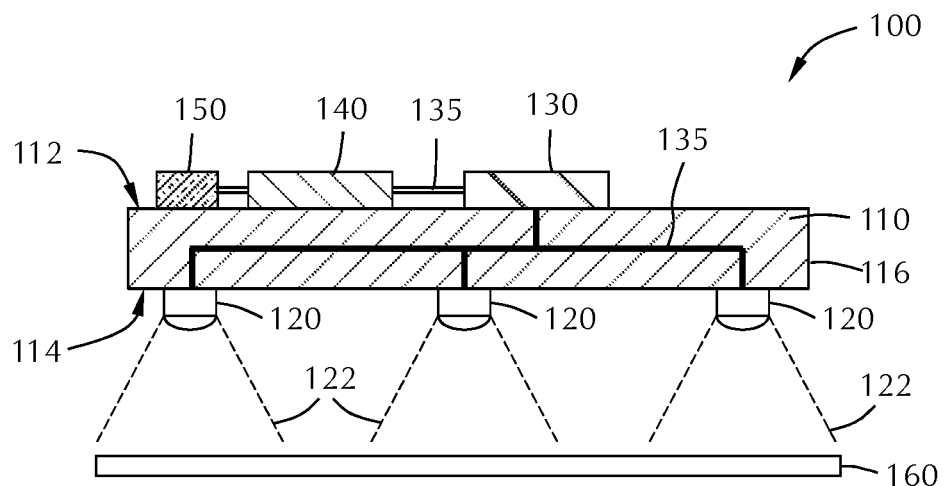
FIG. 2 shows a cross-sectional view of a thermal monitor in accordance with one or more embodiment of the disclosure.

FIGS. 1 and 2 show embodiments of the thermal monitor 100. The main body of the thermal monitor 100 comprises a substrate 110. As used in this manner, a substrate 110 is a surface or component upon which other components (e.g., cameras) are positioned. The substrate 110 can be made from any suitable material including, but not limited to, silicon, aluminum, quartz, glass and ceramic. While a round substrate 110 is shown in the Figures, those skilled in the art will understand that this is merely one possible substrate shape and that other shapes are within the scope of the disclosure.

The substrate 110 includes a top surface 112, a bottom surface 114 and a sidewall 116. In the embodiment shown in FIG. 1, the thermal monitor 100 is inverted so that the bottom surface 114 of the substrate 110 is visible. The substrate 110 has a thickness that is defined as the distance between the top surface 112 and the bottom surface 114. If the top surface 112 and the bottom surface 114 are substantially flat and parallel, the thickness of the substrate 110 is substantially the same as the vertical dimension of the sidewall 116.

Figure 3:
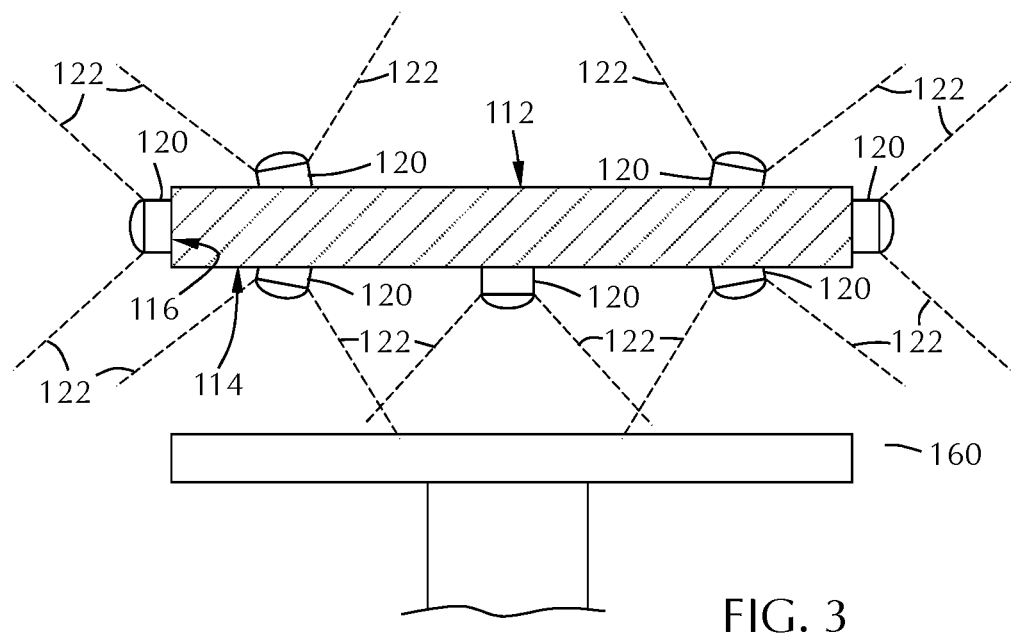
FIG. 3 shows a cross-sectional view of a thermal monitor in accordance with one or more embodiment of the disclosure.

At least one camera 120 is positioned on the bottom surface 114 of the substrate 110. The embodiment shown in FIG. 1 has five cameras 120; however, those skilled in the art will understand that there can be any suitable number of cameras. In some embodiments, there is one camera 120 positioned on the bottom surface 114 of the substrate 110. In some embodiments, there are two, three, four, five, six, seven, eight, nine, 10, 11, 12, 15, 20, 25 or more cameras 120 positioned on the bottom surface 114 or other portions of the substrate 110. For example, as shown in FIG. 3, the substrate 110 has a plurality of cameras 120 positioned on the bottom surface 114, top surface 112 and sidewall 116 of the substrate 110. In some embodiments, there greater than or equal to 2, 3, 4, 5, 6, 7, 8, 9, 10, 11, 12, 13, 14, 15, 16, 17, 18, 19 or 20 cameras 120 on the substrate 110.

The camera 120 can be any suitable camera capable of operating at temperatures greater than about 50° C. In some embodiments, the camera 120 comprises a high resolution thermal imaging camera. In some embodiments, the camera 120 can obtain an image in the visible, ultraviolet (UV), near infrared (NIR), short-wavelength infrared (SWIR), mid-wavelength infrared (MWIR), long-wavelength infrared (LWIR) or far-infrared (FIR). In some embodiments, the camera 120 is operable to take an image in the long-wavelength infrared (LWIR) region of the electromagnetic spectrum. For example, the camera 120 may be operable to capture light with wavelength in the range of about 8 to about 15 μm. In some embodiments, the camera 120 is operable to capture light with wavelengths in the LWIR and FIR regions of the spectrum, for example, with wavelengths in the range of about 8 to about 1000 μm.

The camera 120 can be any suitable size depending on, for example, the amount of space available to insert the thermal monitor 100 into a processing chamber. The size of the camera 120 may also affect the resolution of the camera. A smaller camera has less physical space available for the imaging component. The term "high resolution" is used to describe a camera with an imaging array of greater than or equal to about 3000 pixels in an area of about 100 mm². In some embodiments, the camera is a high resolution camera with greater than or equal to about 3500, 4000 or 4500 pixels in an area of about 100 mm².

In some embodiments, the camera 120 has a thermal sensitivity less than about 200 mK. As used in this regard, the term "thermal sensitivity" means that the electronics of the camera 120 are capable of measuring a temperature difference as small as 200 milli-Kelvin. In some embodiments, the thermal sensitivity of the camera 120 is less than or equal to about 150 mK, 100 mK, 75 mK or 50 mK.

In some embodiments, the camera 120 produces a color gradient image representative of temperature variations. For example, relatively cool temperature regions of the subject may be represented by blue whereas relatively hot temperature regions of the subject may be represented by red, with the gradient of temperatures between the cool and hot regions represented by the intermediate colors. The camera 120 may be capable of producing the color image or the color image may be generated by a separate controller or processor that analyzes the image data captured by the camera.

Each camera 120 has a field of view 122. The field of view 122 of each of the cameras can be adjusted so that there is no overlap of the individual fields of view 122 or so that there is overlap of the fields of view 122. Overlapping fields of view 122, as shown in FIG. 3, may allow for a complete image of the wafer support 160 or processing chamber by combining (e.g., stitching) the separate images together to form a single image.

In the embodiment shown in FIG. 2, each camera 120 has a field of view 122 that do not overlap. The cameras 120 shown have fields of view 122 that align with each other so that the entire wafer support 160 is observed by the plurality of cameras 120. In some embodiments, the fields of view 122 do not overlap and there is a gap between camera fields of view so that a partial view of the wafer support 160 is seen.

The fields of view 122 of the cameras 120 can be substantially the same (e.g., the same angle and relative direction) like that shown in FIG. 2. All of the cameras 120 shown have a field of view 122 directed downward toward the wafer support 160. In some embodiments, each of the plurality of cameras 120 has a different field of view allowing for the monitoring of different directions from the substrate 110. For example, in the embodiment shown in FIG. 3, some of the cameras 120 have fields of view 122 that are directed in different directions and with different angles than other cameras 120. This can be used to form a three-dimensional temperature map of the processing region of the processing chamber.

The thermal monitor 100 includes a wireless communication controller 130. The wireless communication controller 130 can be connected to the cameras 120 and battery 140 through connections 135. As shown in FIGS. 1 and 2, the connections 135 can be on the same side of the substrate 110 or passing through the substrate 110. The order of connections shown in the Figures is merely representative and should not be taken as indicating a specific combination and electrical circuit connections.

The wireless communication controller 130 can be any component that can transmit data wirelessly from the inside of a processing chamber. The wireless communication protocol can be any suitable type of communication process. The communication process can use a communication standard, for example, wi-fi or Bluetooth.

The thermal monitor 100 also includes a battery 140 to power the camera 120 and wireless communication controller 130. The battery 140 is connected to the camera 120 and the wireless communication controller 130 through connections 135. The battery 140 can be any suitable battery capable of supplying sufficient power to operate the camera 120 and wireless communications controller 130 and any other components on the thermal monitor 100 that uses power (e.g., a microcontroller or microprocessor). Suitable batteries include, but are not limited to, cell-phone compatible power supplies, lithium ion batteries, lithium polymer batteries and alkaline batteries.

In some embodiments, as shown in FIG. 2, the thermal monitor 100 further comprises a microcontroller 150 connected to the wireless communication controller 130, the camera 120 and the battery 140. As used in this manner, a "microcontroller" includes firmware based microcontrollers and software based microprocessors. The microcontroller 150 is any component that is capable of controlling the camera 120 and wireless communication controller 130. The microcontroller 150 of some embodiments is capable of analyzing or processing data received from the camera(s) 120 and transmit the processed data through the wireless communications controller 130. In some embodiments, the wireless communications controller 130 is an integral component of the microcontroller 150. In some embodiments, the microcontroller 150 is configured to process data received from the at least one camera 120 and transmit the processed data through the wireless communication controller 130. The microcontroller 150 of some embodiments is powered by the battery 140. In some embodiments, the microcontroller 150 has a separate power source from the battery 140.

Referring to FIG. 3, some embodiments of the disclosure are directed to methods of monitoring temperature of a wafer support 160 in a processing chamber 200. The processing chamber 200 includes a chamber wall 202 with a bottom wall 203 and a sidewall 204. A lid 205 positioned on the chamber wall 202 encloses a processing volume 206.

A wafer support 160, also referred to as a substrate support, is positioned within the processing volume 206 of the processing chamber 200. The wafer support 160 includes a shaft 161 and at least one thermal element 162. The shaft 161 passes through an opening 163 in the bottom wall 203 of the processing chamber 200 and is connected to a motor 164. The motor 164 can be capable of rotating the wafer support 160 and moving the wafer support 160 in the z-axis. A bellows 166 forms a vacuum tight seal around the opening 163 in the bottom wall 203.

The processing chamber can also include a gas distribution assembly 170 which can be positioned, as shown, adjacent the lid 205, or in other locations within the processing volume 206. The gas distribution assembly 170 is configured to flow at least one reactive or inert gas into the processing volume 206. The gas distribution assembly 170 is generally spaced apart from the wafer support 160.

Figure 4:
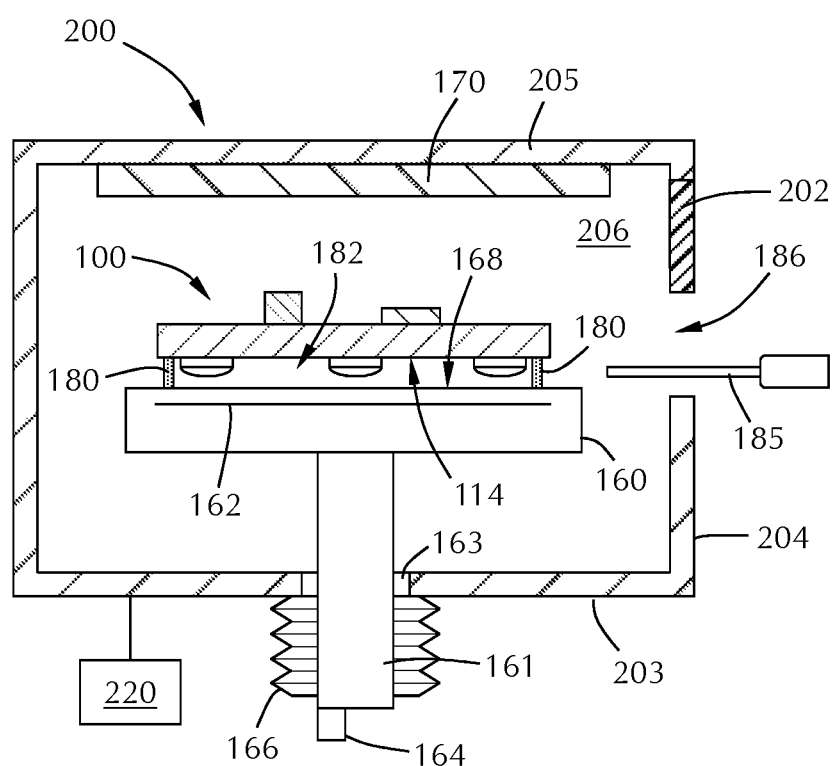
FIG. 4 shows a cross-sectional view of a processing chamber with a thermal monitor in accordance with one or more embodiment of the disclosure.

A thermal monitor 100 is positioned on a plurality of lift pins 180 in the processing chamber 200. The number of lift pins 180 can be any suitable number as is understood by those skilled in the art. The embodiment of FIG. 4 shows two lift pins 180; however those skilled in the art will understand that there is generally three or more lift pins 180 to support the thermal monitor 100 or a wafer for processing.

The thermal monitor 100 is brought into the process volume 206 through slit valve 186 by robot 185. The robot 185 and lift pins 180 can be controlled by controller 220 to coordinate the movements of the lift pins 180 and the robot 185.

The robot 185 deposits the thermal monitor 100 on the lift pins so that there is a gap 182 between a top surface 168 of the wafer support 160 and the bottom surface 114 of the thermal monitor 100. The gap 182 can be any suitable size depending on, for example, the length of the lift pins 180 and the field of view 122 of the cameras 120. In some embodiments, the gap is greater than about 1 inch, 2 inches, 3 inches or 4 inches.

The temperature of the wafer support 160 or the top surface 168 of the wafer support 160 can be measured using the camera(s) 120 of the thermal monitor 100. In some embodiments, the camera 120 produces a color gradient image representative of temperature variations on the wafer support 160. The data received from the camera(s) 120 can be communicated directly through the wireless communications controller 130 to a system outside of the processing chamber 200 for further processing. In some embodiments, the data received from the camera(s) 120 is processed by a microcontroller 150 and the processed data is transmitted through the wireless communications controller 130.

In some embodiments, the processed color gradient image is evaluated to determine temperature variations of the wafer support 160. The local temperature of the wafer support 160 can be modified based on the processed data to decrease or increase the temperature variations in the wafer support 160. For example, the controller 220 can evaluate the data, or act on data evaluated by the microcontroller 150 and can increase or decrease power to thermal elements 162 in the wafer support 160. A multi-zonal thermal element system in the wafer support 160 can allow for pinpoint control of the temperature and thermal variations.

After measurement of the temperature and any data processing, the thermal monitor 100 is removed from the process volume 206 of the processing chamber 200. The thermal monitor 100 can be removed by the robot 185 through slit valve 186. In some embodiments, the lift pins 180 do not lower the thermal monitor 100 to contact the wafer support 160. Stated differently, the lift pins 180 of some embodiments maintains a distance between the top surface 168 of the wafer support 160 and any component on the thermal monitor 100.

The thickness of the thermal monitor 100 including all components thereon (e.g., battery, communications controller, cameras) is sufficiently small to pass through a slit valve 186. In some embodiments, the thermal monitor 100 has a total thickness less than or equal to about 1 inch.

The thermal monitor 100, including any component positioned thereon (e.g., camera 120, wireless communications controller 130, battery 140 and microcontroller 150) are operable at temperatures in the range of about 50° C. to about 500° C. In some embodiments, the thermal monitor 100 and any components thereon, are operable at temperatures greater than or equal to about 100° C., 150° C., 200° C. or 250° C.

The process of measuring the temperature profile of the wafer support can be relatively quick. The entire process—loading the thermal monitor into the processing chamber, measuring the temperature profile and removing the thermal monitor—can be accomplished in less than about one minute. In some embodiments, the entire process occurs in the range of about 5 to about 30 seconds or in the range of about 10 to about 20 seconds.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of monitoring temperature of a wafer support in a processing chamber, the method comprising:
    positioning a thermal monitor on a plurality of lift pins, the thermal monitor having a substrate with at least one camera, a wireless communication controller and a battery, the at least one camera positioned on a bottom surface of the substrate and having a field of view, the battery connected to the at least one camera and the wireless communication controller, the plurality of lift pins supporting the thermal monitor so that there is a gap between the wafer support and the bottom surface of the thermal monitor; and
    measuring the temperature of the wafer support using the at least one camera on the thermal monitor.

2. The method of claim 1, wherein the at least one camera comprises a high resolution thermal imaging camera.

3. The method of claim 2, wherein the at least one camera produces a color gradient image representative of temperature variations.

4. The method of claim 3, further comprising processing the color gradient image from the at least one camera and transmitting the processed color gradient image using the wireless communication controller.

5. The method of claim 4, further comprising evaluating the processed color gradient image to determine temperature variations of the wafer support and a local temperature of the wafer support to modify the temperature variations.

6. The method of claim 5, wherein there are a plurality of cameras on the substrate, each camera having a field of view overlapping to provide a complete image of the wafer support.

7. The method of claim 4, wherein the wireless communication controller is configured to communicate through one or more of a wi-fi or Bluetooth standard.

8. The method of claim 7, wherein the thermal monitor further comprises a microcontroller configured to process data received from the at least one camera and transmit the processed data through the wireless communication controller.

* * * * *